(12) United States Patent
Demange et al.

(10) Patent No.: US 7,170,790 B2
(45) Date of Patent: Jan. 30, 2007

(54) SENSING CIRCUIT

(75) Inventors: Nicolas Demange, St. Maximin (FR); Antonino Conte, Tremestieri Etneo (IT); Salvatore Preciso, Catania (IT); Alfredo Signorello, Tremestieri Etneo (IT)

(73) Assignees: STMicroelectronics S.r.l., Agrate Brianza (IT); STMicroelectronics S.A., Montrouge (FR)

( * ) Notice: Subject to any disclaimer, the term of this patent is extended or adjusted under 35 U.S.C. 154(b) by 0 days.

(21) Appl. No.: 11/061,104

(22) Filed: Feb. 18, 2005

(65) Prior Publication Data
US 2005/0201169 A1 Sep. 15, 2005

(30) Foreign Application Priority Data
Feb. 19, 2004 (EP) ................... 04290449

(51) Int. Cl.
*G11C 16/06* (2006.01)
(52) U.S. Cl. .................. 365/185.21; 365/207
(58) Field of Classification Search ........... 365/185.21, 365/207
See application file for complete search history.

(56) References Cited

U.S. PATENT DOCUMENTS 5,255,233 A 10/1993 Izumi
5,422,854 A 6/1995 Hirano et al.
2003/0016572 A1* 1/2003 Pascucci ................. 365/200
2004/0062116 A1 4/2004 Takano et al.
2004/0228162 A1* 11/2004 Pasotti et al. ............. 365/154

FOREIGN PATENT DOCUMENTS

EP 0 814 484 12/1997
JP 2003-173691 6/2003

OTHER PUBLICATIONS

Annex to European Search Report dated Jul. 12, 2004 for European Application No. 04290449.0.

* cited by examiner

*Primary Examiner*—Thong Q. Le
(74) *Attorney, Agent, or Firm*—Lisa K. Jorgenson; Fleit, Kain, Gibbons, Gutman, Bongini & Bianco P.L.

(57) ABSTRACT

A sensing circuit (120) for sensing currents, including: a measure circuit branch (132i), having a measure node for receiving an input current (Ic) to be sensed, for converting the input current into a corresponding input voltage (V−); at least one comparison circuit branch (132o), having a comparison node for receiving a comparison current (Igs), for converting the comparison current into a corresponding comparison voltage (V+); and at least one voltage comparator (140) for comparing the input and comparison voltages, and a comparison current generating circuit (N3s, 135; N3s, 135'; N3s, 135") for generating the comparison current based on a reference current (Ir). The comparison current generating circuit includes at least one voltage generator (135; 135'; 135"). A memory device using the sensing circuit and a method are also provided.

19 Claims, 3 Drawing Sheets

SENSING CIRCUIT

CROSS-REFERENCE TO RELATED APPLICATION

This application is based upon and claims priority from prior European Patent Application No. 04290449.0, filed on Feb. 19, 2004, the entire disclosure of which is herein incorporated by reference.

BACKGROUND OF THE INVENTION

1. Field of the Invention

The present invention relates to a sensing circuit for sensing currents, particularly of the type used in semiconductor memory devices, such as non-volatile memory devices, for accessing memory cells in reading.

2. Description of the Related Art

A sensing circuit for semiconductor memory devices includes a plurality of sense amplifiers and, during a reading operation, every sense amplifier compares the current flowing through a respective selected memory cell (memory cell current) with a comparison current, for discriminating the content of the selected memory cell. A current/voltage (I/V) converter, usually implemented by transistors connected in current-mirror configuration, converts the memory cell and comparison currents into corresponding voltage signals, which are fed to a voltage comparator. In particular, the memory cell current is provided to an input circuit branch of the I/V converter, in such a way as to be mirrored on an I/V converter output circuit branch receiving the comparison current. The voltage comparator is connected to respective nodes of the input and output branches of the I/V converter and provides an output binary signal, function of the difference between the memory cell current and the comparison current, thus corresponding to the content of the memory cell.

Typically, the comparison current is obtained from a reference current, provided by a reference cell structurally identical to the memory cells to be read. In detail, a voltage generator receives the reference current and converts it into a suitable drive voltage for a transistor which provides the comparison current to the I/V converter output circuit branch.

In a solution known in the art, the voltage generator comprises a circuit similar to the I/V converter, i.e. having a current-mirror architecture. Particularly, the voltage generator includes a main circuit branch coupled to the reference cell and a mirroring circuit branch in parallel to the main branch, on which the reference current is mirrored. A suitable node of the mirroring branch provides the drive voltage corresponding to the reference current.

In order to limit the energy consumption, the voltage generator is usually kept switched off, to be switched on when the memory device is accessed for a reading operation. The switching-on time of the voltage generator is critical for the access time of the memory device, because, in order to have a correct reading, the comparison current, and thus the drive voltage of the transistor generating it, has to rapidly reach the prescribed, steady state value.

A setting time of the voltage generator is influenced by its output capacitive load, which depends on several factors, particularly on the size and the data parallelism of the memory device. In fact, the voltage generator is usually common to all the sense amplifiers of the memory device and, in the case of large memory devices having high data parallelism, it has to drive a great capacitive load; this increases the setting time of the generated voltage. A long setting time impacts on the access time of the memory device and favors an error probability of a reading operation.

On the other hand, if, in order to reduce the setting time, the output parasitic capacitances of the voltage generator are kept low, the resulting generated voltage would be affected by noise. In fact, a further drawback of the use of current mirror circuits for the voltage generator is the typical poor noise rejection versus the reference voltage (ground) or the supply voltage. Especially in presence of low capacitive loads, a poor noise rejection impairs the operation of the sensing circuit by further increasing the reading error probability.

For a best buffering of the drive voltage, an alternative solution is to exploit a plurality of mirroring circuit branches in parallel to the main circuit branch in the voltage generator. However, this contrasts to the requirement of minimizing the semiconductor area occupied by the memory device.

Accordingly, there exists a need for overcoming the disadvantages of the prior art as discussed above.

SUMMARY OF THE INVENTION

In view of the state of the art outlined in the foregoing, it is an object of the present invention to overcome the above-mentioned drawbacks. In order to achieve this object, a sensing circuit for sensing currents as set out in the first claim is proposed.

Briefly, an aspect of the present invention provides a sensing circuit for sensing currents, including at least one sense amplifier, comprising: a measure circuit branch, having a measure node for receiving an input current to be sensed, for converting the input current into a corresponding input voltage; at least one comparison circuit branch, having a comparison node for receiving a comparison current, for converting the comparison current into a corresponding comparison voltage; and at least one voltage comparator for comparing the input and comparison voltages, and means for generating the comparison current based on a reference current, the means comprising: at least one voltage generator for receiving the reference current and for generating a corresponding sense amplifier biasing voltage; and means for converting the sense amplifier biasing voltage into the comparison current, wherein the at least one voltage generator includes a first circuit branch, having a first node for receiving the reference current, for converting the reference current into a corresponding reference voltage, a second circuit branch, having a second node for receiving a regulation current, in current mirror configuration with the first circuit branch for mirroring a current corresponding to the reference current, the second circuit branch generating by conversion a non-regulated voltage corresponding to the mirrored current and to the regulation current, and voltage regulator means receiving the reference voltage and the non-regulated voltage for regulating the sense amplifier biasing voltage by controlling the non-regulated voltage through the regulation current.

Moreover, the present invention provides a memory device including that sensing circuit. A corresponding method of sensing an input current is also encompassed.

BRIEF DESCRIPTION OF THE DRAWINGS

Further features and the advantages of the solution according to the present invention will be made clear by the following description of preferred embodiments thereof, given purely by way of a non-restrictive example, with reference to the attached figures, in which.

DETAILED DESCRIPTION

Figure 1:
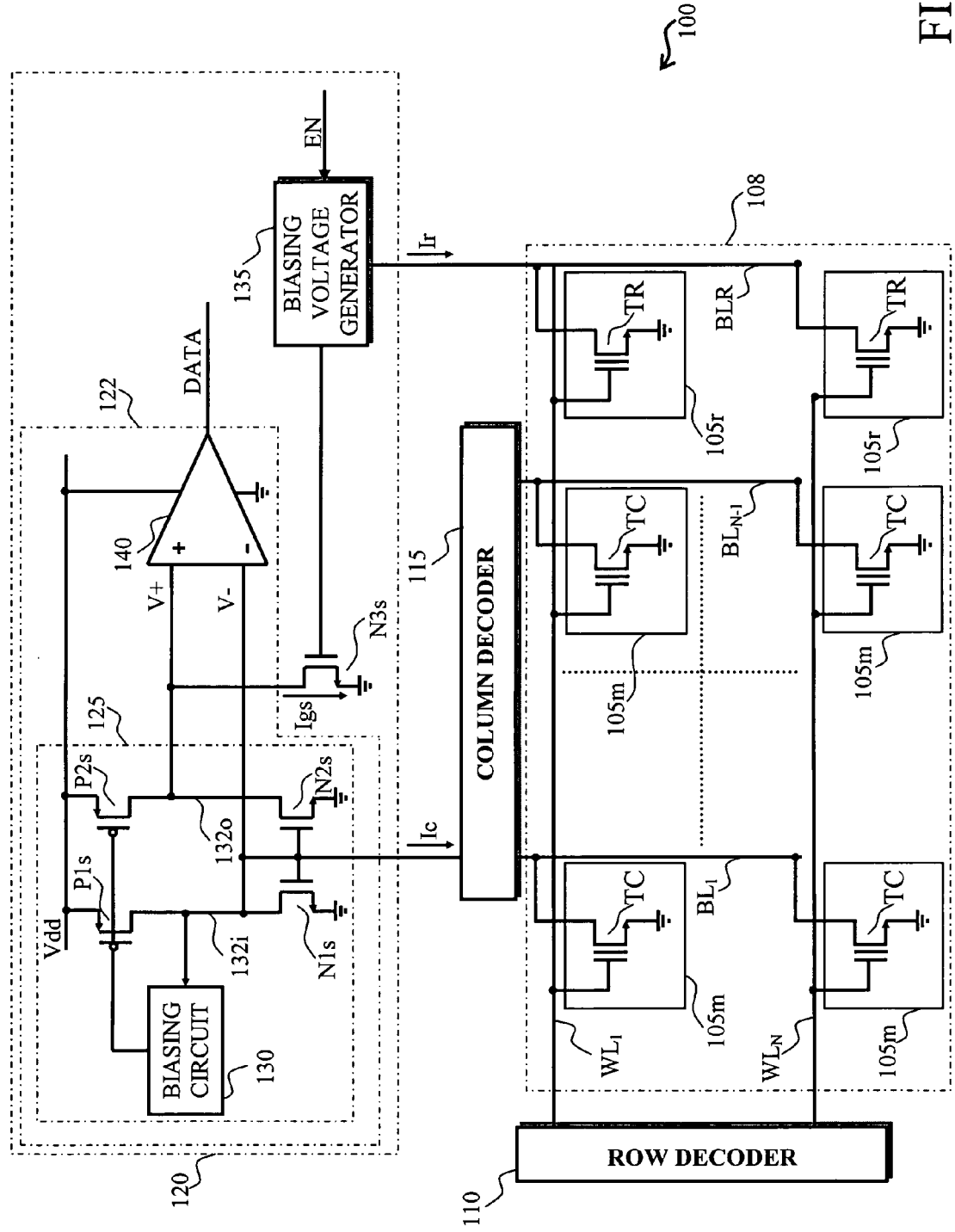
FIG. 1 shows schematically a portion of a non-volatile memory device in which the present invention is applicable.

With reference in particular to FIG. 1, a portion of a non-volatile memory device 100, such as a flash memory device, in which the present invention is applicable, is schematically shown. The non-volatile memory device 100 includes a plurality of non-volatile memory cells 105m and a plurality of reference cells 105r, arranged in a matrix 108 comprising a number M of rows and a number N of columns. In detail, and by way of example only, each row includes one reference cell 105r, exploited during a reading operation on the memory device 100, and all the reference cells 105r are arranged in a same column. In such an arrangement, the memory cells 105m and the reference cell 105r of the same row can have substantially identical electrical characteristics and sizes.

Each row of the matrix 108 is controlled by a respective wordline WLi (i=1, . . . , M), each column of memory cells 105m is controlled by a respective bitline BLj (j=1, . . . , N−1), and the column of reference cells 105r is controlled by a reference bitline BLR. The generic memory cell 105m is univocally identified by the respective wordline WLi and bitline BLj; similarly, the generic reference cell 105r is univocally identified by the respective wordline WLi and reference bitline BLR.

A row decoder 110 is connected to the wordlines WLi and a column decoder 115 is connected to the bitlines BLj for selecting the desired memory cells 105m and the respective reference cells 105r by applying suitable voltages during operation. In particular, during reading operations on the memory cells 105m, the row decoder 110 and the column decoder 115 are responsive to address codes (not shown) corresponding to respective memory cells 105m.

Each memory cell 105m is for example implemented by a floating gate MOS transistor TC having a drain terminal connected to the corresponding bitline BLj, a control gate terminal connected to the corresponding wordline WLi and a source terminal connected to a reference terminal (providing a reference voltage, or ground). Similarly, each reference cell 105r is implemented by a floating gate MOS transistor TR, having a drain terminal connected to the reference bitline BLR.

The memory cells 105m can be programmed in a plurality of states, which are associated with corresponding ranges of the threshold voltage of the memory cell. For example, in the case of a two-level memory device, the memory cells 105m have two possible programming states, respectively corresponding to a high logic value "1" and a low logic value "0", associated by convention with increasing values of the threshold voltage. Thus, a bit of information can be written into a memory cell 105m and a conduction current Ic (typically of the order of tens of microamperes), flowing through a selected memory cell 105m properly biased, corresponds to the stored logic value. Increasing threshold voltages correspond to decreasing memory cell conduction currents and, then, a value of the conduction current Ic "1" corresponding to a high logic value is greater than a value of the conduction current Ic "0" corresponding to a low logic value.

Preferably, the reference cells 105r have a programming state corresponding to the high logic value, so that they sink, when selected for a reading operation (i.e., when biased in substantially the same way as the selected memory cells 105m), a reference current Ir, roughly equal to the conduction current Ic "1" of the memory cells 105m storing a high logic value.

A sensing circuit 120 of the memory device 100 includes a plurality of sense amplifiers 122 (only one of which is shown in the drawing, for simplicity of illustration) for performing reading operations on the memory cells 105m. Particularly, during a reading operation, a sense amplifier 122 is connected to a respective selected bitline BLj and senses the conduction current Ic sunk by a respective selected memory cell 105m. Typically, the number of sense amplifiers 122 is at least equal to the data parallelism of the memory device 100, i.e., to the number of bits in a memory device data word, for example eight or sixteen.

In each sense amplifier 122 an I/V converter 125 converts current signals into voltage signals; the I/V converter 125 comprises a circuit having a current mirror architecture. Two n-MOS transistors N1s and N2s have respective gate terminals connected together and respective source terminals connected to a reference voltage line or ground; the n-MOS transistor N1s is in diode configuration, having a drain terminal connected to the gate terminal.

Two p-MOS transistors P1s and P2s have respective source terminals connected to a supply voltage line, distributing a supply voltage Vdd of the memory device 100, and respective gate terminals connected together to a biasing circuit 130 for a proper biasing during operation. The biasing circuit 130 has an input connected to a drain terminal of the p-MOS transistor P1s. For example, the biasing circuit 130 may be a simple short circuit, thereby the p-MOS transistor P1s is in diode configuration.

Drain terminals of the n-MOS transistors N1s and N2s are connected to drain terminals of the p-MOS transistors P1s and P2s, respectively. Furthermore, the gate terminals of the n-MOS transistors N1s and N2s are connected, together with the drain terminals of the n-MOS N1s and of the p-MOS transistor P1s, to the bitline BLj selected by the column decoder 115, for example the bitline BL1.

The peculiar interconnection of the two n-MOS transistors N1s and N2s in the I/V converter 125 forms a current mirror having a first and a second circuit branches 132i and 132o, comprising the transistors N1s and P1s and the biasing circuit 130, and the transistors N2s and P2s, respectively. The two n-MOS transistors N1s and N2s are equivalent, i.e. they have roughly equal electrical characteristics, and a current mirroring ratio is thus substantially equal to 1. Furthermore, the two p-MOS transistors P1s and P2s are also equivalent, so as to have roughly equal loads on the first and second circuit branches 132i and 132o of the I/V converter 125.

A further n-MOS transistor N3s has a source terminal connected to ground and a drain terminal connected to the drain terminals of the p-MOS and n-MOS transistors P2s and N2s. A gate terminal of the n-MOS transistor N3s receives a sense amplifier biasing voltage Vsab (hereinafter referred to as sense-amp biasing voltage Vsab), generated by a biasing voltage generator 135, through a sense amplifier biasing voltage distribution line.

The sensing circuit 120 includes at least one biasing voltage generator 135, which is connected to the reference bitline BLR controlling the reference cells 105r. The biasing voltage generator 135 receives the reference current Ir sunk by a selected reference cell 105r during a reading operation, and provides the corresponding sense-amp biasing voltage Vsab, which is distributed to the gate terminals of the n-MOS transistors N3s in each sense amplifier 122 through the sense amplifier biasing voltage distribution line. The biasing voltage generator 135 receives an enabling signal EN, which is asserted for enabling (switch on) the biasing voltage generator 135, for example when a reading operation has to be performed, and which is de-asserted for disabling (switching off) the biasing voltage generator 135.

The n-MOS transistor N3s is such that, when properly biased by the sense-amp biasing voltage Vsab, a comparison current Igs flowing therethrough has an intermediate value between the values of the conduction current Ic "1" (corresponding to the high logic value) and the conduction current Ic "0" (corresponding to the low logic value).

Each sense amplifier 122 further comprises a voltage comparator 140 comprising a differential amplifier having an inverting input terminal ("−") connected to the drain terminals of the p-MOS and n-MOS transistors P1s and N1s, and a non-inverting input terminal ("+") connected to the drain terminals of the p-MOS transistor P2s and of the n-MOS transistors N2s and N3s. The inverting and non-inverting input terminals of the voltage comparator 140 are at respective voltages V− and V+ that depend on voltage drops across the p-MOS transistors P1s and P2s, respectively. An output terminal of the voltage comparator 140 provides a binary voltage signal DATA, which takes one of two possible voltage values depending on the fact that the voltage V+ is higher than the voltage V− or that the voltage V+ is lower than the voltage V−.

During a reading operation on the memory device 100, the circuit branch 132i of the I/V converter 125 of the sense amplifier 122 receives the conduction current Ic of the selected memory cell 105m at the drain terminal of the transistors N1s and P1s, whereas the biasing voltage generator 135 receives the reference current Ir of the reference cell 105r. The biasing voltage generator 135 generates the corresponding sense-amp biasing voltage Vsab, which is distributed to the gate terminal of the n-MOS transistor N3s through the sense-amp biasing voltage distribution line.

The biasing circuit 130 brings the gate terminals of the p-MOS transistors P1s and P2s to a suitable voltage, such that the drain terminal of the p-MOS transistor P1s is maintained at a voltage roughly constant for any value (within an intended range of values) of the conduction current Ic. A current flowing through the n-MOS transistor N1s is mirrored into the circuit branch 132o, thereby a substantially equal current flows through the n-MOS transistor N2s. At the steady state, the comparison current Igs flows through the n-MOS transistor N3s and, for the current balance at the input terminals of the voltage comparator 140, the difference between the voltage V+ and the voltage V− at the input terminals of the voltage comparator 140 depends on the difference between the memory cell conduction current Ic and the comparison current Igs.

Thus, the signal DATA at the output terminal of the voltage comparator 140 is a function of the difference between the conduction current Ic and the comparison current Igs, and corresponds to the content of the selected memory cell 105m. In particular, a value taken by the signal DATA corresponds to the high logic value when the conduction current Ic is greater than the comparison current Igs, and corresponds to the low logic value when the conduction current Ic is smaller than the comparison current Igs.

Alternatively, only one reference cell is included in the matrix of cells of the memory device, or a plurality of reference cells is provided for each row of memory cells; also, a two-dimensional arrangement of reference cells can be provided. The memory cells can be programmed in a greater number of programming states, for example four programming states in the case of four-level memory cells (2 bits stored in each cell). With four-level memory cells the architecture of the sensing circuits changes accordingly, more than one reference cell being necessary and, possibly, more than one voltage comparator for a reading operation on one memory cell.

Similar considerations apply if only one sense amplifier 122 is provided in the sensing circuit 120 of the memory device 100. The I/V converter 125 can be implemented by a different number and type of transistors and, in addition, by using other circuital elements, such as resistors as load elements. Furthermore, the sense-amp biasing voltage Vsab can be applied to a different number of transistors for generating the comparison current Igs, or also to different circuital elements.

Alternatively, the comparison current Igs may be substantially equal, for example, to the conduction current Ic "1", and the current mirror circuit 132i, 132o is correspondingly unbalanced, that is the current mirrored into the circuit branch 132o is not equal, but proportional (according to a prescribed proportionality factor) to the memory cell conduction current Ic.

Figure 2:
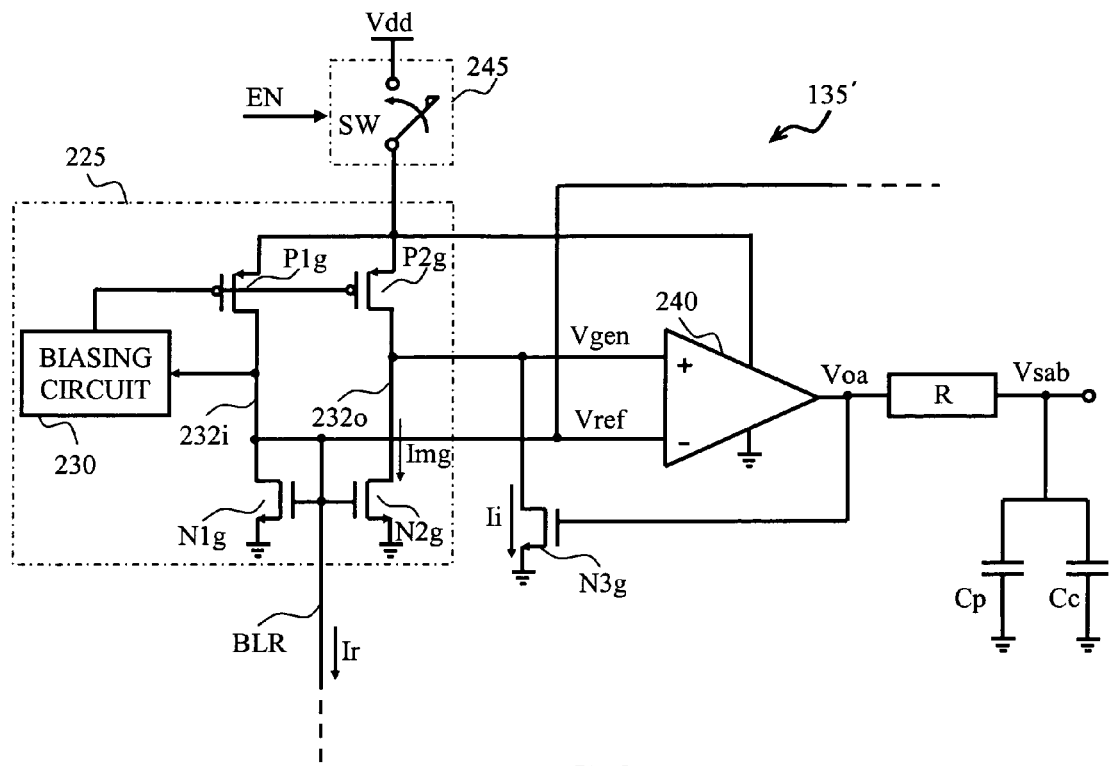
FIG. 2 illustrates a biasing voltage generator, according to an embodiment of the present invention, used in a sensing circuit of the memory device of FIG. 1.

Considering now FIG. 2, an embodiment 135' of the biasing voltage generator is illustrated. The architecture of the biasing voltage generator 135' is similar to the architecture of the sense amplifier 122 and equivalent elements in the two circuits are therefore indicated substituting the suffix 's' for the suffix 'g'.

The biasing voltage generator 135' comprises an I/V converter 225 having a current-mirror architecture. Two p-MOS transistors P1g and P2g have respective drain terminals connected to a supply voltage terminal, providing the supply voltage Vdd when the biasing voltage generator 135' is switched on. Two n-MOS transistors N1g and N2g have respective gate terminals connected together to the reference bitline BLR and the n-MOS transistor N1g is in diode configuration. A voltage at respective drain terminals of the n-MOS and p-MOS transistors N1g and P1g, connected together, is input to a biasing circuit 230, which properly biases respective gate terminals of the p-MOS transistors P1g and P2g.

The I/V converter 225 includes a first and a second circuit branches 232i and 232o, comprising the transistors N1g and P1g and the biasing circuit 230, and the transistors N2g and P2g, respectively. The current mirror of the I/V converter 225 has a current mirroring ratio substantially equal to 1 and roughly equal loads, the two n-MOS transistors N1g and N2g and the two p-MOS transistors P1s and P2s having roughly equal electrical characteristics.

Similarly to the sense amplifier 122, the biasing voltage generator 135 further includes a differential amplifier 240, such as an operational amplifier, having an inverting input terminal "−" connected to the drain terminals of the transistors N1g and P1g, and a non-inverting input terminal "+" connected to the drain terminals of the transistors N2g and P2g. A n-MOS transistor N3g has a gate terminal connected in feedback to an output terminal of the operational amplifier 240, a source terminal connected to ground and a drain terminal connected to the non-inverting input terminal of the operational amplifier 240.

The output terminal of the operational amplifier 240 is further connected to a first terminal of a resistor R (for example, of about 1 kΩ). A second terminal of the resistor R is connected to an output voltage line of the biasing voltage generator 135' providing the sense-amp biasing voltage Vsab; the output voltage line of the biasing voltage generator 135' is connected to the sense-amp biasing voltage distribution line that distributes the sense-amp biasing voltage Vsab to the sensing amplifiers. The resistor R ensures a proper connection of the sense-amp biasing voltage distribution line to output lines of possible additional circuits, in an embodiment to be discussed later on.

In FIG. 2 an enabling/disabling structure 245 of the biasing voltage generator 135' is extremely schematically illustrated, represented by means of a switch SW placed between the supply voltage line, providing the supply voltage Vdd, and the supply voltage terminal. The switch SW is driven by the enabling signal EN, that is asserted for connecting the supply voltage terminal to the supply voltage line, so as to switch the biasing voltage generator 135' on. The enabling signal EN is de-asserted for keeping the supply voltage terminal disconnected from the supply voltage line.

During a reading operation, the selected reference cell 105r supplies the reference current Ir to the first circuit branch 232i of the I/V converter 225. The biasing circuit 230 brings the gate terminals of the p-MOS transistors P1g and P2g to a suitable voltage, such that the drain terminal of the p-MOS transistor P1g is maintained at a voltage roughly constant for any value (within an intended range of values) of the reference current Ir. A current flowing through the n-MOS transistor N1g is mirrored into a current Img flowing through the n-MOS transistor N2g, and a regulation current Ii flows through the n-MOS transistor N3g.

For the current balance at the input terminals of the operational amplifier 240, an amplified voltage Voa at the output terminal thereof depends on the difference between the reference current Ir and the regulation current Ii. For example, if the regulation current Ii is smaller then the reference current Ir, a voltage Vgen at the non-inverting input terminal of the operational amplifier 240 is greater than a voltage Vref at the inverting input terminal of the operational amplifier 240, so that the amplified voltage Voa at the output terminal of the operational amplifier 240, i.e. at the gate terminal of the n-MOS transistor N3g, increases. As a consequence, the regulation current Ii increases and the voltage Vgen decreases, tending to become equal to the voltage Vref.

In this way, the regulation current Ii at the non-inverting input terminal of the operational amplifier 240 and the reference current Ir at the inverting input terminal tend to become equal for reaching a steady state of the amplified voltage Voa in which it assumes a value such that the n-MOS transistor N3g supplies a current roughly equal to the reference current Ir. It has to be observed that the operational amplifier 240 and the n-MOS transistor N3g act as a voltage regulator for providing at the output a regulated, relatively stable sense-amp biasing voltage Vsab.

The biasing voltage generator 135', including the above-mentioned voltage regulator, acts as a buffering circuit able to efficiently drive even large capacitive loads, for example due to parasitic and coupling capacitances Cp and Cc (typically of the order of tens of picofarads, such as 20–30 pF), seen in output to the biasing voltage generator 135'. Thanks to the exploitation of a differential amplifier, such as the operational amplifier 240, the biasing voltage generator 135' has a relatively short switching-on time that substantially does not impact on an access time of the memory device 100 and on the reading error probability.

Being able to drive relatively large capacitances, the biasing voltage generator 135' can be exploited also in memory devices having high data parallelism, i.e. eight or sixteen sense amplifiers 122 can be connected to a same biasing voltage generator 135'. As a consequence, it is not necessary to devise solutions for reducing output parasitic capacitances, and, advantageously, a high output capacitive load improves the noise rejection versus ground or a supply voltage line, and, thus, the operation of the sensing circuit.

Similar consideration apply if the current mirror circuit 232i, 232o is unbalanced, that is the regulation current Ii is not equal, but proportional to the reference current Ir. Alternatively, circuital elements different from a resistor are connected in series between the operational amplifier 240 and the sense-amp biasing voltage line.

Figure 3:
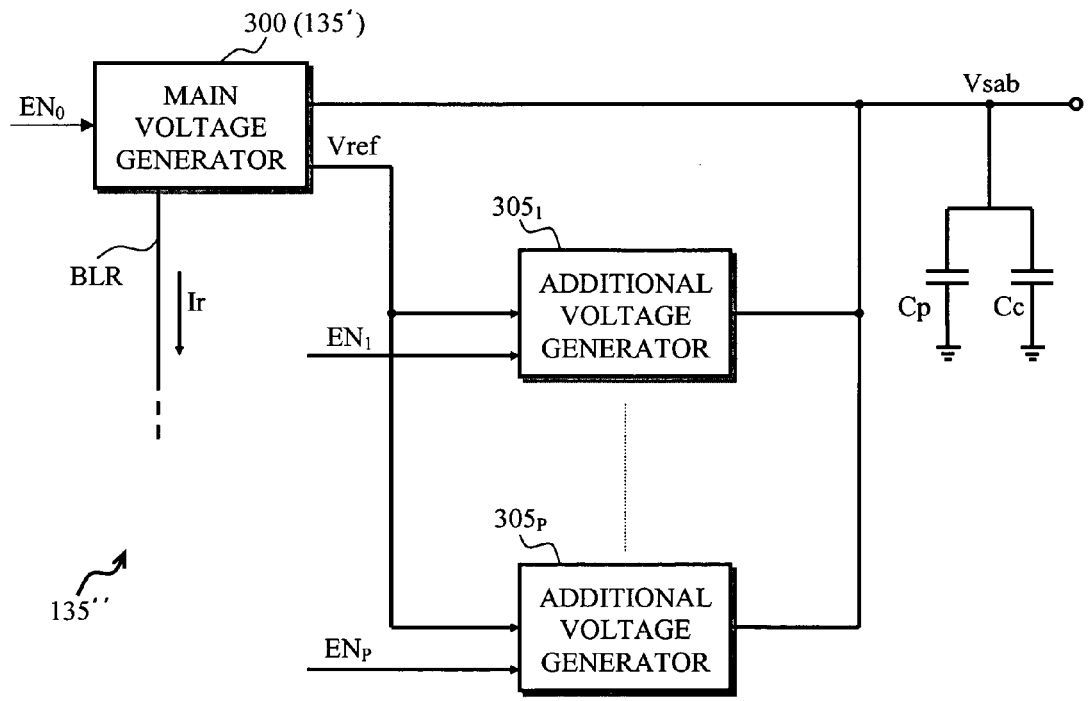
FIG. 3 shows schematically a biasing voltage generator, according to another embodiment of the present invention, comprising a main biasing voltage generator and a plurality of additional voltage generators.

As schematically shown in FIG. 3, to further improve the operation efficiency of the sensing circuit of the non-volatile memory device, an alternative embodiment 135" of the biasing voltage generator includes a main voltage generator 300, substantially identical to the biasing voltage generator 135' of the above-described embodiment, connected to a number P of additional voltage generators 3051–305P in parallel.

The main voltage generator 300 provides the voltage Vref (taken at the inverting terminal of the operational amplifier 240 described with reference to FIG. 2) to each additional voltage generator 3051–305P. Similarly to the main voltage generator 300, each additional voltage generator 3051–305P provides the sense-amp biasing voltage Vsab at a respective output voltage line connected together to the output voltage line of the main voltage generator 300, and thus to the sense-amp biasing voltage distribution line for distributing the sense-amp biasing voltage Vsab to each sense amplifier.

Furthermore, the enabling signal EN received by the biasing voltage generator 135" includes a plurality of signals EN0 and ENk (where k is an index and k=1, . . . , P); the signal En0 is received by the main voltage generator 300, while each one of the signals EN1–ENP is received by the respective additional voltage generator 3051–305P. When the signal ENk is asserted, the respective additional voltage generator 305k is selectively switched on; on the contrary, when the signal ENk is de-asserted, the respective additional voltage generator 305k is selectively switched off. In this way, only desired additional voltage generators 3051-305P can be switched on or all the additional voltage generators 3051-305P can be switched off.

Figure 4:
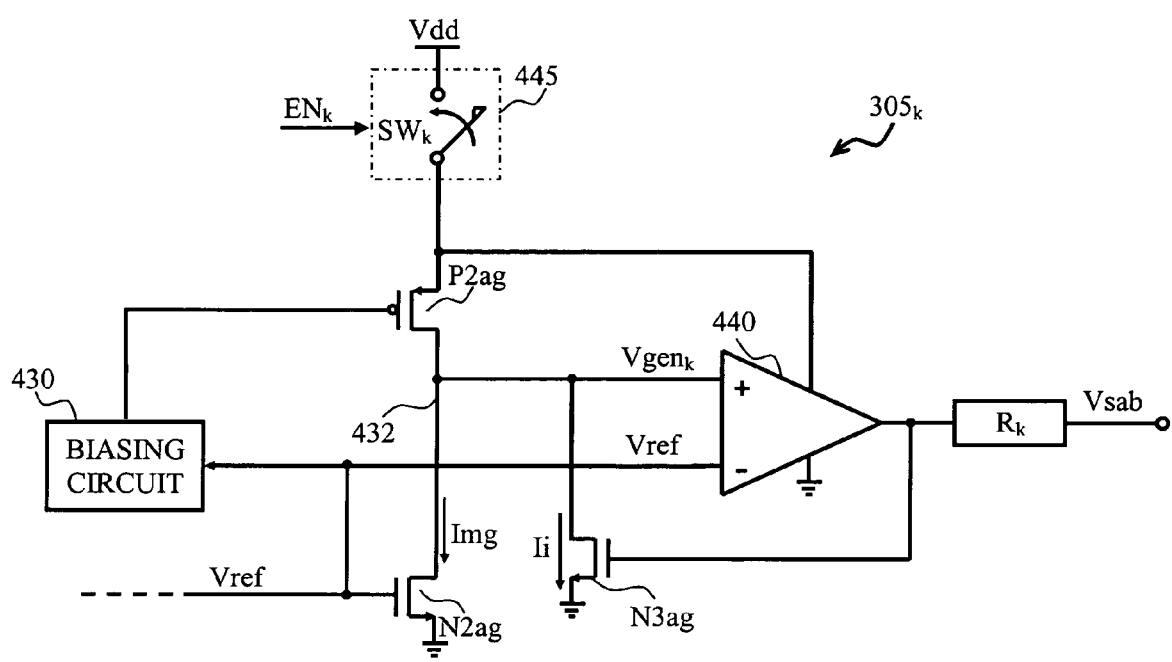
FIG. 4 illustrates in greater detail one of the additional voltage generators of FIG. 3, in an embodiment of the present invention.

Considering FIG. 4, a generic additional voltage generator 305k according to an embodiment of the invention is shown in greater detail. The additional voltage generator 305k has a structure similar to the main voltage generator 300, described with reference to FIG. 2.

Compared to the I/V converter 225 exploited in the main voltage generator 300, the additional voltage generator 305k comprises only one circuit branch 432 formed by n-MOS and p-MOS transistors N2ag and P2ag having respective drain terminals connected together. The n-MOS transistor N2ag has a source terminal connected to ground and a gate terminal receiving the voltage Vref from the main voltage generator 300.

A biasing circuit 430 receives in input the voltage Vref and properly biases a gate terminal of the p-MOS transistor P2g; a source terminal of the p-MOS transistor P2g is connected to an additional supply voltage terminal, providing the supply voltage Vdd when the additional voltage generator 305p has to be switched on.

An operational amplifier 440 receives the voltage Vref at an inverting input terminal and a voltage Vgenp at a non-inverting input terminal connected to the drain terminals of the transistors N2ag and P2ag. An n-MOS transistor N3ag has a drain terminal connected to the non-inverting input terminal of the operational amplifier 440 and a source terminal connected to ground. Similarly to the main voltage generator 300, a gate terminal of the n-MOS transistor N3ag is connected to the output terminal of the operational amplifier 440. The operational amplifier 440 and the n-MOS transistor N3ag allow the equalization of the voltages Vgenk and Vref.

A resistor Rk, connected in series between the output terminal of the operational amplifier 440 and the output voltage line of the additional voltage generator 305p, providing the sense-amp biasing voltage Vsab, allows minimizing conflicts due to the voltage differences coming from different offsets of the main and additional voltage generators 300 and 3051–305P.

Similarly to the main voltage generator 300, the additional voltage generator 305k comprises an enabling/disabling structure 445, including a switch SWk between the supply voltage line and the additional supply voltage terminal. The enabling/disabling structure 445 receives the signal ENk and, when the signal ENk is asserted, the additional voltage generator 305k is switched on.

Alternatively, the additional voltage generators are implemented with a different structure. For example, the additional voltage generators receive the voltage Vgen from the main voltage generator. In this case, the other circuit branch of an I/V converter, similar to that exploited in the main voltage generator and in the sense amplifier, is used.

Naturally, in order to satisfy specific requirements, a person skilled in the art may apply to the solution described above many modifications and alterations all of which, however, are included within the scope of protection of the invention as defined by the following claims.

While there has been illustrated and described what is presently considered to be embodiments of the present invention, it will be understood by those of ordinary skill in the art that various other modifications may be made, and equivalents may be substituted, without departing from the true scope of the present invention.

Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A sensing circuit for sensing currents, comprising:
a measure circuit branch, having a measure node for receiving an input current to be sensed, for converting the input current into a corresponding input voltage;
at least one comparison circuit branch, having a comparison node for receiving a comparison current, for converting the comparison current into a corresponding comparison voltage;
at least one voltage comparator for comparing the input and comparison voltages; and
means for generating the comparison current based on a reference current, the means comprising:
at least one voltage generator for receiving the reference current and for generating a corresponding sense amplifier biasing voltage; and
means for converting the sense amplifier biasing voltage into the comparison current,
wherein
the at least one voltage generator includes:
a first circuit branch, having a first node for receiving the reference current, for converting the reference current into a corresponding reference voltage;
a second circuit branch, having a second node for receiving a regulation current, in current mirror configuration with the first circuit branch for mirroring a current corresponding to the reference current, the second circuit branch generating by conversion a non-regulated voltage corresponding to the mirrored current and to the regulation current; and
voltage regulator means receiving the reference voltage and the non-regulated voltage for regulating the sense amplifier biasing voltage by controlling the non-regulated voltage through the regulation current.

2. The sensing circuit according to claim 1, wherein the voltage regulator means includes a differential amplifier for amplifying a voltage difference between the non-regulated and reference voltages, and a feedback network for converting the amplified voltage difference into the regulation current.

3. The sensing circuit according to claim 2, wherein the feedback network comprises at least one transistor having a current delivery terminal connected to the second node and a control terminal receiving the amplified voltage difference.

4. The sensing circuit according to claim 2, wherein the differential amplifier is an operational amplifier.

5. The sensing circuit according to claim 4, wherein the feedback network comprises at least one transistor having a current delivery terminal connected to the second node and a control terminal receiving the amplified voltage difference.

6. The sensing circuit according to claim 1, wherein the measure circuit branch and the at least one comparison circuit branch are in current mirror configuration, for mirroring the input current into the at least one comparison circuit branch.

7. The sensing circuit according to claim 1, wherein the at least one voltage generator further includes at least one additional voltage generator comprising:
an additional circuit branch, having an additional node for receiving the regulation current, in current mirror configuration with the first circuit branch for mirroring the current corresponding to the reference current, the additional circuit branch generating by conversion an additional non-regulated voltage corresponding to the mirrored current and to the regulation current; and
additional voltage regulator means receiving the reference voltage and the additional non-regulated voltage for regulating the sense amplifier biasing voltage by controlling the additional non-regulated voltage through the regulation current.

8. The sensing circuit according to claim 7, further including enabling means for selectively switching on or switching off the at least one additional voltage generator.

9. A memory device including at least one memory cell and one sensing circuit for sensing a current supplied by the at least one memory cell, wherein the sensing circuit comprising:

a measure circuit branch, having a measure node for receiving an input current to be sensed, for converting the input current into a corresponding input voltage;

at least one comparison circuit branch, having a comparison node for receiving a comparison current, for converting the comparison current into a corresponding comparison voltage; and at least one voltage comparator for comparing the input and comparison voltages; and means for generating the comparison current based on a reference current, the means comprising:

at least one voltage generator for receiving the reference current and for generating a corresponding sense amplifier biasing voltage; and means for converting the sense amplifier biasing voltage into the comparison current, wherein the at least one voltage generator includes:

a first circuit branch, having a first node for receiving the reference current, for converting the reference current into a corresponding reference voltage;

a second circuit branch, having a second node for receiving a regulation current, in current mirror configuration with the first circuit branch for mirroring a current corresponding to the reference current, the second circuit branch generating by conversion a non-regulated voltage corresponding to the mirrored current and to the regulation current; and voltage regulator means receiving the reference voltage and the non-regulated voltage for regulating the sense amplifier biasing voltage by controlling the non-regulated voltage through the regulation current.

10. The memory device according to claim 9, including at least one reference cell for supplying the reference current.

11. The memory device according to claim 9, wherein the voltage regulator means includes a differential amplifier for amplifying a voltage difference between the non-regulated and reference voltages, and a feedback network for converting the amplified voltage difference into the regulation current.

12. The memory device according to claim 11, wherein the feedback network comprises at least one transistor having a current delivery terminal connected to the second node and a control terminal receiving the amplified voltage difference.

13. The memory device according to claim 11, wherein the differential amplifier is an operational amplifier.

14. The memory device according to claim 13, wherein the feedback network comprises at least one transistor having a current delivery terminal connected to the second node and a control terminal receiving the amplified voltage difference.

15. The memory device according to claim 9, wherein the measure circuit branch and the at least one comparison circuit branch are in current mirror configuration, for mirroring the input current into the at least one comparison circuit branch.

16. The memory device according to claim 9, wherein the at least one voltage generator further includes at least one additional voltage generator comprising:

an additional circuit branch, having an additional node for receiving the regulation current, in current mirror configuration with the first circuit branch for mirroring the current corresponding to the reference current, the additional circuit branch generating by conversion an additional non-regulated voltage corresponding to the mirrored current and to the regulation current; and additional voltage regulator means receiving the reference voltage and the additional non-regulated voltage for regulating the sense amplifier biasing voltage by controlling the additional non-regulated voltage through the regulation current.

17. The memory device according to claim 16, further including enabling means for selectively switching on or switching off the at least one additional voltage generator.

18. A method of sensing an input current, including:

receiving the input current at a measure node of a measure branch of a sense amplifier;

converting the input current into a corresponding input voltage;

receiving a reference current;

generating a sense amplifier biasing voltage corresponding to the reference current;

converting the sense amplifier biasing voltage into a comparison current;

receiving the comparison current at a comparison node of at least one comparison circuit branch of the sense amplifier;

converting the comparison current into a corresponding comparison voltage; and comparing the input and comparison voltages, wherein generating the sense amplifier biasing voltage includes receiving the reference current at a first node of a first circuit branch of at least one voltage generator;

converting the reference current into a corresponding reference voltage;

mirroring a current corresponding to the reference current into a second circuit branch of the at least one voltage generator in current mirror configuration with the first circuit branch;

receiving a regulation current at a second node of the second circuit branch; generating by conversion a non-regulated voltage corresponding-to the mirrored current and to the regulation current;

providing the reference and non-regulated voltages to voltage regulator means; and regulating the sense amplifier biasing voltage by controlling the non-regulated voltage through the regulation current.

19. A sensing circuit for sensing currents, comprising:

a measure circuit branch, having a measure node for receiving an input current to be sensed, for converting the input current into a corresponding input voltage;

at least one comparison circuit branch, having a comparison node for receiving a comparison current, for converting the comparison current into a corresponding comparison voltage, wherein the at least one comparison circuit branch is arranged to be crossed by a current related to the input current to be sensed and to the comparison current;

at least one voltage comparator for comparing the input and comparison voltages; and means for generating the comparison current based on a reference current, the means comprising:

at least one voltage generator for receiving the reference current and for generating a corresponding sense amplifier biasing voltage; and means for converting the sense amplifier biasing voltage into the comparison current, wherein
the at least one voltage generator includes:
- a first circuit branch, having a first node for receiving the reference current, for converting the reference current into a corresponding reference voltage;
- a second circuit branch, having a second node for receiving a regulation current, in current mirror configuration with the first circuit branch for mirroring a current corresponding to the reference current, the second circuit branch generating by conversion a non-regulated voltage corresponding to the mirrored current and to the regulation current; and voltage regulator means receiving the reference voltage and the non-regulated voltage for regulating the sense amplifier biasing voltage by controlling the non-regulated voltage through the regulation current.

* * * * *